United States Patent
Haymes et al.

(10) Patent No.: US 8,375,269 B2
(45) Date of Patent: Feb. 12, 2013

(54) DATA TRANSMISSION SYSTEM AND METHOD OF CORRECTING AN ERROR IN PARALLEL DATA PATHS OF A DATA TRANSMISSION SYSTEM

(75) Inventors: Charles L. Haymes, Fair Lawn, NJ (US); Jose A. Tierno, Stamford, CT (US)

(73) Assignee: International Business Machines Corporation, Armonk, NY (US)

( * ) Notice: Subject to any disclaimer, the term of this patent is extended or adjusted under 35 U.S.C. 154(b) by 1184 days.

(21) Appl. No.: 12/024,078

(22) Filed: Jan. 31, 2008

(65) Prior Publication Data

US 2009/0199070 A1 Aug. 6, 2009

(51) Int. Cl.
*H03M 13/00* (2006.01)
*H03M 13/19* (2006.01)
(52) U.S. Cl. ......... 714/757; 714/758; 714/746; 714/752
(58) Field of Classification Search ................ 714/757
See application file for complete search history.

(56) References Cited

U.S. PATENT DOCUMENTS

| | | | |
|---|---|---|---|
| 6,184,806 B1* | 2/2001 | Patapoutian et al. | 341/59 |
| 6,374,389 B1* | 4/2002 | Tuma et al. | 714/802 |
| 6,738,935 B1* | 5/2004 | Kimmitt | 714/701 |
| 6,868,514 B2* | 3/2005 | Kubo et al. | 714/755 |
| 7,613,958 B2* | 11/2009 | Lesartre et al. | 714/701 |
| 7,685,496 B2* | 3/2010 | Toyoda | 714/758 |
| 2005/0238093 A1* | 10/2005 | Payne et al. | 375/224 |
| 2005/0249236 A1* | 11/2005 | Walden | 370/465 |
| 2008/0114562 A1* | 5/2008 | Sul et al. | 702/122 |
| 2010/0192049 A1* | 7/2010 | Lee et al. | 714/804 |

OTHER PUBLICATIONS

Furutani, K.; Arimoto, K.; Miyamoto, H.; Kobayashi, T.; Yasuda, K.; Mashiko, K.; , "A built-in Hamming code ECC circuit for DRAMs," Solid-State Circuits, IEEE Journal of , vol. 24, No. 1, pp. 50-56, Feb. 1989, doi: 10.1109/4.16301.*

* cited by examiner

*Primary Examiner* — Albert Decady
*Assistant Examiner* — Justin R Knapp
(74) *Attorney, Agent, or Firm* — Anne V. Dougherty, Esq.; McGinn IP Law Group, PLLC (57) ABSTRACT

A data transmission system includes parallel data paths for transmitting data, and an encoder for encoding the data such that an error correction code is generated for data at a same bit position across the parallel data paths.

13 Claims, 6 Drawing Sheets

*Uncoded data (12 bits)*

| 11 | 10 | 9 | 8 | 7 | 6 | 5 | 4 | 3 | 2 | 1 | 0 | ⌒ 101a

*Uncoded data with error correction added(16 bits)*

| 15 | 14 | 13 | 12 | 11 | 10 | 9 | 8 | 7 | 6 | 5 | 4 | 3 | 2 | 1 | 0 | ⌒ 102a

*8B/10B coded data with error correction added(20 bits)*

| 19 | 18 | 17 | 16 | 15 | 14 | 13 | 12 | 11 | 10 | 9 | 8 | 7 | 6 | 5 | 4 | 3 | 2 | 1 | 0 | ⌒ 103a

*Single error introduced during data transmission*

| 19 | 18 | 17 | 16 | 15 | 14 | 13 | 12 | 11 | 10 | 9 | 8 | 7 | 6 | 5 | 4 | 3 | 2 | 1 | 0 | ⌒ 103b

*Single error increased to multiple errors after 8B/10B decoding*

| 15 | 14 | 13 | 12 | 11 | 10 | 9 | 8 | 7 | 6 | 5 | 4 | 3 | 2 | 1 | 0 | ⌒ 102b

*Error correction failure causing multiple errors*

| 11 | 10 | 9 | 8 | 7 | 6 | 5 | 4 | 3 | 2 | 1 | 0 | ⌒ 101b

Direction of data transmission

| | | | | | | | | | | | | | |
|---|---|---|---|---|---|---|---|---|---|---|---|---|---|
| bit 7 | 0 | 0 | 0 | 1 | 0 | 0 | 0 | 0 | 1 | 1 | 0 | 0 | 0 |
| bit 6 | 0 | 0 | 1 | 1 | 0 | 0 | 0 | 1 | 1 | 0 | 1 | 1 | 1 |
| bit 5 | 0 | 1 | 0 | 1 | 0 | 0 | 0 | 1 | 1 | 1 | 1 | 0 | 0 |
| bit 4 | 1 | 1 | 0 | 0 | 1 | 1 | 0 | 0 | 1 | 1 | 0 | 0 | 1 |
| bit 3 | 1 | 1 | 1 | 0 | 0 | 0 | 1 | 1 | 0 | 0 | 1 | 0 | 1 | 0 |
| bit 2 | 1 | 0 | 0 | 0 | 1 | 1 | 1 | 0 | 0 | 0 | 1 | 1 | 1 | 0 |
| bit 1 | 0 | 1 | 0 | 0 | 0 | 0 | 1 | 0 | 0 | 1 | 0 | 0 | 0 | 1 |
| bit 0 | 1 | 0 | 0 | 1 | 0 | 1 | 0 | 0 | 0 | 0 | 1 | 1 | 0 | 0 |

DATA TRANSMISSION SYSTEM AND METHOD OF CORRECTING AN ERROR IN PARALLEL DATA PATHS OF A DATA TRANSMISSION SYSTEM

BACKGROUND OF THE INVENTION

1. Field of the Invention

The present invention relates to a data transmission system and more particularly, a system and method of correcting an error in parallel data paths of a data transmission system.

2. Description of the Related Art

The simplest error correction codes protect against random errors that are introduced into the data stream. The errors are modeled as random events with no statistical correlation to each other or any part of the overall system. Additional bits are added to the data to protect against errors. The effect of the additional error correction bits, is to map the uncoded data into a coded domain.

In the coded domain, valid codewords are selected to represent the uncoded data, and all other invalid codewords are assumed to result from transmission errors. The most common error correcting codes can only correct one error contained within a set block of data. If more that one error occurs within the covered data, it cannot be corrected. If there are enough errors within the correction domain, the codes will breakdown completely, and may actually cause more errors in correct data.

There is a growing trend in system interconnection toward very high speed serial interfaces. There are several industry initiatives to specify these connections. Some of the most notable include Infiniband (e.g., a switched fabric communications link) and the XAUI interface (e.g., an attachment unit interface) in the IEEE 802.3ae specification. IBM offers a family of custom application specific integrated circuit (ASIC) macros known as high speed serial (HSS) to support these interfaces. In these applications, a data bus is transmitted serially at higher speed down fewer lanes.

Reformatting the data for transmission may negate error correction that was originally on the data bus. For example, in the XAUI interface, a 32-bit bus is segmented into four byte-wide sections. Each byte is 8b/10b coded for transmission down four 3.125 Gbps transmission lanes. At the receiving side of the interface, the four transmitted data streams are decoded and reassembled into the original 32-bit bus. If the original data bus was coded with a single error correcting hamming code, it would perform very poorly in this architecture.

Figure 1:
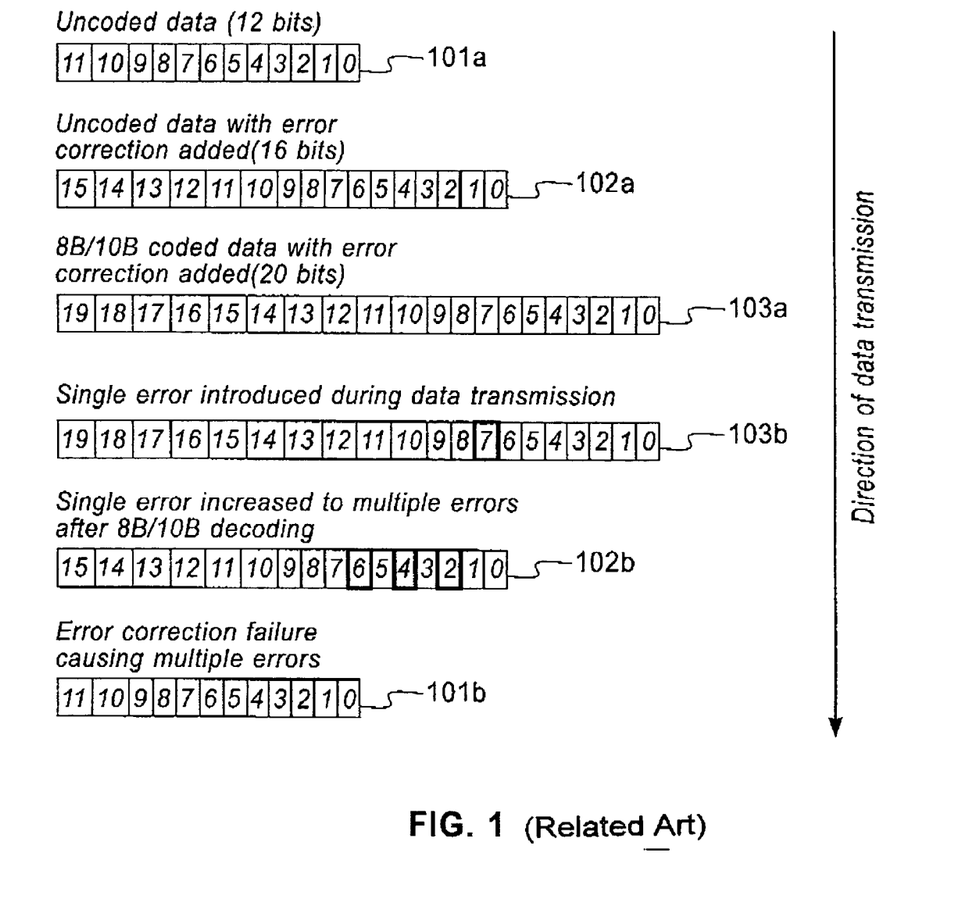
FIG. 1 illustrates a conventional error correction method (e.g., in a single channel or 8b/10b encoded data)

FIG. 1 illustrates a conventional error correction method (e.g., in a single channel or 8b/10b encoded data). As illustrated in FIG. 1, data transmission may begin with first data 101a which is uncoded and includes 12 bits, then error correction may be added to provide second data 102a which is uncoded and includes 16 bits. The second data 102a may be 8b/10b encoded to provide a third data 103a which includes error correction and includes 20 bits.

Assuming that an error is introduced into the "7" bit in the third data 103a during transmission as depicted in third data 103b, this error may be increased to multiple errors in the "6", "4" and "2" bits after 8b/10b decoding as depicted in second data 102b, resulting in first data 101b which includes the multiple errors caused by the failed error correction.

That is, as illustrated in FIG. 1, a single error in an 8b/10b code word may generate multiple bit errors when the code word is decoded. These multiple bit errors are beyond the ability of the single error correcting code to handle.

In cases where 8b/10b coding is not used, burst errors on any single lane of the four lane set will negate the error correction on the whole interface.

To make the problem worse, decision feedback equalization (DFE), is being used in new serial interfaces. The IBM high speed serial-deserializer (HSS) macros offer DFE modes. Decision feedback equalization uses the history of what was transmitted before to help in determining the value of the current bit. This powerful equalization works well to remove intersymbol interference.

However, DFE tends to transform single hit errors into multi-bit burst errors. If noise causes a single bit to switch polarity, the feedback nature of DFE will recirculate the error and use the wrong information in the future decisions. The error may be propagated forward for an unbounded number of bits.

Applying simple burst error protection on every lane will help, but cannot correct every case. Likewise, interleaving may help, but there will be cases where the burst length is too long for traditional methods to correct.

There are several known methods which have attempted to this problem in conventional error correction methods. For example, the error correction coding can be made strong enough to handle multiple bit errors. However, this method is a poor solution because the data link is really only generating single bit errors, and the error multiplication is an artifact of the decoder (e.g., either 8b/10b or DFE). Single bit correcting error correction codes are relatively simple and easy to implement, but multiple bit correcting codes require considerable overhead and also use much more power. In the 8b/10b case, the code can be strengthened to cover the 10-bit code word, but due to the unbounded nature of the DFE case, there is no way to make the code strong enough to cover any-length errors.

Another conventional method is to interleave the data prior to coding and transmitting the data. This process collects a large block of data and combines bits from different regions of the data and groups them before encoding and transmission. After transmission, the bits are redistributed back into their original positions before error correction is applied.

The goal of interleaving is to spread grouped transmission errors apart before errors are corrected so each error falls into a different error correction domain. This process is widely used, but adds significant latency to the system and is not useful in high speed systems where latency must be reduced. Also, in the DFE system, it is not possible to design an interleaving system that will always work because the length of the error burst in unbounded.

SUMMARY OF THE INVENTION

In view of the foregoing and other exemplary problems, drawbacks, and disadvantages of the conventional methods and structures, a purpose of the exemplary aspects of the present invention is to provide a data transmission system and more particularly, a method of correcting an error in parallel data paths of a data transmission system.

An exemplary aspect of the present invention is directed to a data transmission system which includes parallel data paths for transmitting data, an encoder for encoding said data such that an error correction code is generated for data at a same bit position across said parallel data paths.

Another exemplary aspect of the present invention is directed to a method of correcting an error in parallel data paths of a data transmission system. The method includes providing data transmitted in parallel data paths, and encoding said data such that an error correction code is generated for data at a same bit position across said parallel data paths.

An alternative exemplary aspect of the present invention is directed to a programmable storage medium tangibly embodying a program of machine-readable instructions executable by a digital processing apparatus to perform a method of correcting an error in parallel data paths in a data transmission system, said method including providing data transmitted in parallel data paths, and encoding said data such that an error correction code is generated for data at a same bit position across said parallel data paths.

Still another exemplary aspect of the present invention is directed to a method of correcting an error in parallel data paths in a data transmission system, which includes deploying computing infrastructure in which computer-readable code is integrated into a computing system, such that said code and said computing system combine to perform said providing data transmitted in parallel data paths, and encoding said data such that an error correction code is generated for data at a same bit position across said parallel data paths.

With its unique and novel features, the present invention provides a data transmission system and more particularly, a method of correcting an error in parallel data paths of a data transmission system which may work effectively for high speed systems (e.g., >12 Gb/s).

BRIEF DESCRIPTION OF THE DRAWINGS

The foregoing and other exemplary purposes, aspects and advantages will be better understood from the following detailed description of an exemplary embodiment of the invention with reference to the drawings, in which.

DETAILED DESCRIPTION OF EXEMPLARY EMBODIMENTS OF THE INVENTION

Referring now to the drawings, and more particularly to FIGS. 2-8, there are shown exemplary embodiments of the method and structures of the present invention.

The present invention includes a novel architecture that may use structural characteristics of parallel data paths to strengthen a standard error correction code. Although this architecture may be discussed herein as targeted to a specific class of communication systems, the architecture can be easily generalized to other systems.

Figure 2:
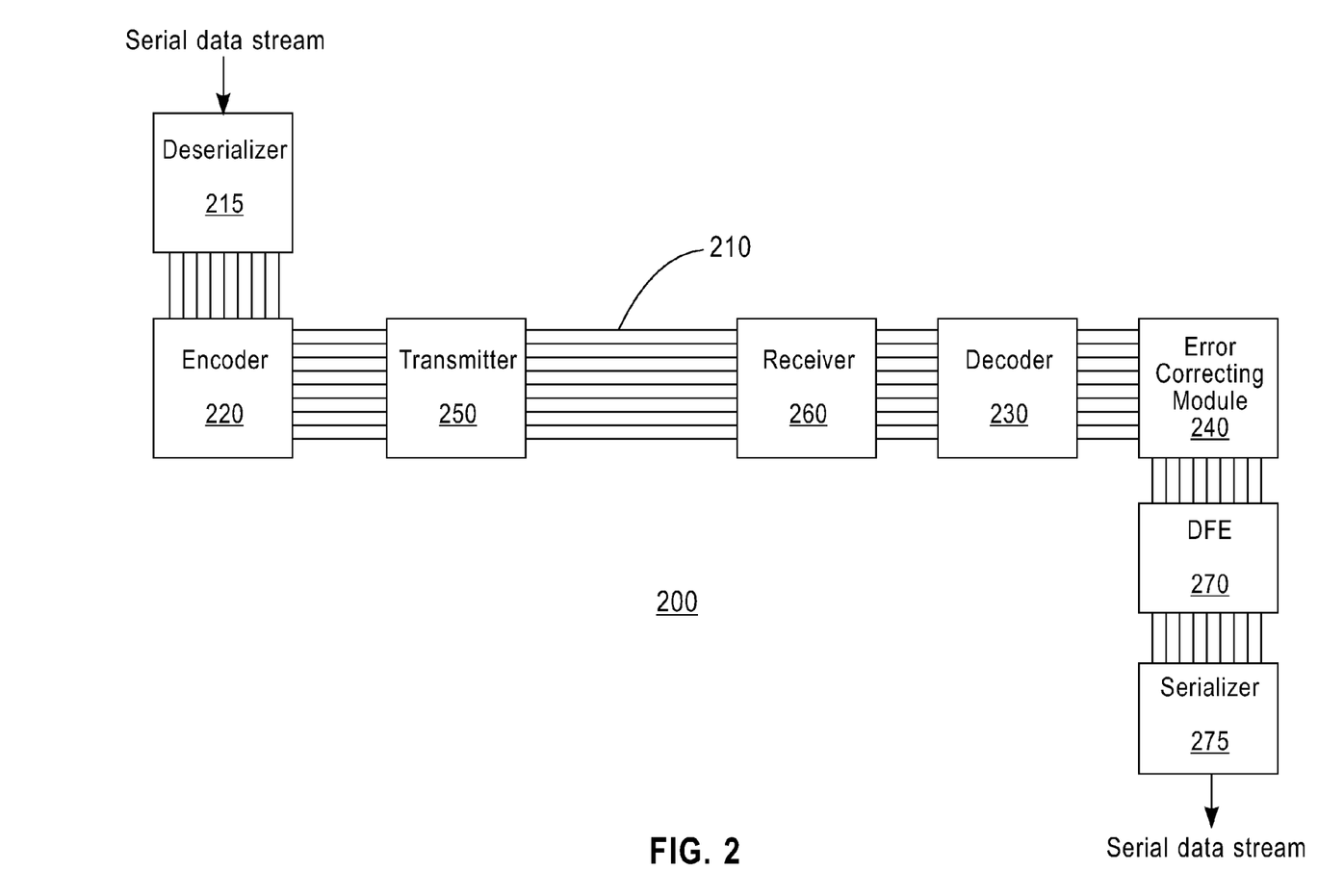
FIG. 2, illustrates a data transmission system 200, according to an exemplary aspect of the claimed invention.

As illustrated in FIG. 2, an exemplary aspect of the present invention is directed to a data transmission system 200 which includes parallel data paths 210 (e.g., parallel channels) for transmitting data, and an encoder 220 for encoding the data such that an error correction code is generated for data at a same bit position across the parallel data paths. The error correction code may include, for example, a parity code such as a Hamming code.

The data may be, for example, digital data and may be transmitted via an optical signal or an electrical signal.

As illustrated in FIG. 2, the system 200 may also include a decoder 230 for decoding the encoded data, and an error correcting module 240 for correcting an error in the decoded data. (e.g., by performing a parallel operation on data at a same bit position across the parallel data paths). The system 200 may also include a transmitter 250 (e.g., an electrical or optical signal transmitter) for transmitting the data, and a receiver 260 (e.g., an electrical or optical signal receiver) for receiving the data transmitted by the transmitter. The parallel data paths 210 may transmit the data from the transmitter 250 to the receiver 260.

The system 200 may also include a decision feedback equalizer (DFE) 270 for removing intersymbol interference in the data (e.g., the electrical or optical signal transmitting the data). Although in FIG. 2, the DFE 270 is depicted as included in the receiver side of the parallel data paths 210 the DFE 270 may be included in the transmitter side. In particular, the DFE 270 may be located in one of the transmitter 250 and the receiver 260 (e.g., in a serial interface coupled to one of the transmitter 250 and the receiver 260).

The system 200 may also include a deserializer 215 for converting a serial data stream into a parallel data stream which may be input to the encoder 220, and a serializer 275 for converting a parallel data stream into a serial data stream.

The present invention may be applied to systems where data is transmitted on parallel data paths (e.g., multiple parallel channels). Unlike in single-channel serial transmission systems, in the present invention, a physical separation of the transmission channels (e.g., transmission data paths) may be used to physically isolate errors on one channel from errors on the other channels.

Further, the present invention may organize the data payload and error correction overhead in a manner to maximize this characteristic of de-coupled errors and assure that any error propagation does not compromise the error correction process. The present invention may also allow the use of a simple single error correcting code because the errors may be isolated from each other.

Referring again to the drawings, the encoder 220 may receive a data stream (e.g., a parallel data stream) and generate a block code for encoding the data stream. The block code may operate over N bytes of data that have to be transmitted over N+P data paths (e.g., transmission channels such as an optical channel or optical fiber, or an electrical wire), with P being the number of data paths that are available for parity and sparing. That is, a first step in the coding process of the encoder 220 may be to generate a block code (e.g., a N/(N+P) hamming code) that may have single error correction/double error detection (SEC/DED) properties, at the bit level.

That is, parity may be generated for bit 0 of all bytes, bit 1 of all bytes, etc. This may require a constraint on N and P, namely:

$$N+P \leq 2^{P-1}$$ Equation (1)

Figure 3:
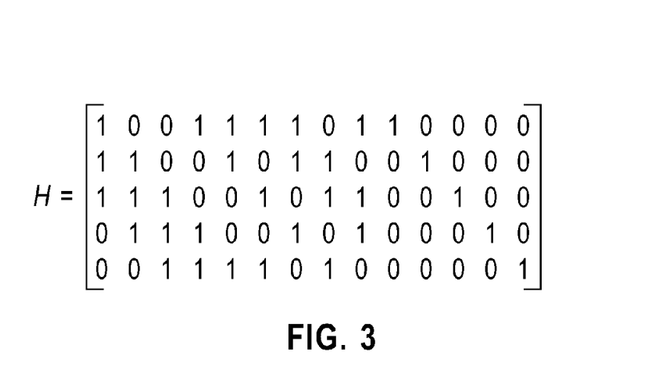
FIG. 3 illustrates an example of an H matrix for a 9/14 hamming code with single error correction/double error detection (SEC/DED) capabilities, according to an exemplary aspect of the claimed invention.

FIG. 3 illustrates an example of an H matrix for a 9/14 hamming code with single error correction/double error detection (SEC/DED) capabilities. The properties of the H matrix may include the following: 1) All columns are different. That way, all single bit errors are detectable, and 2) All columns have odd parity. Therefore the syndrome for all double bit errors is even, and all double bit errors are detectable. Some care was taken to balance the rows of the H-matrix in FIG. 3 such that the implementation of the code may be balanced in fan-out. This operation may generate a block of bits that is M×(N+P) (e.g., 8×14, where N=9 and P=5), where M is the number of bits in a byte of data (e.g., where M=8).

It should be noted that the above example is not limiting. That is, the values of M, N and P may be other than those values given in the Example above, so long as the constraint of Equation 1 are met. Further, the block of bits generated by error encoding the data, may be further coded with a serializer (e.g., a serial-link) friendly code such as, for example, an 8b/10b code.

Figure 4:
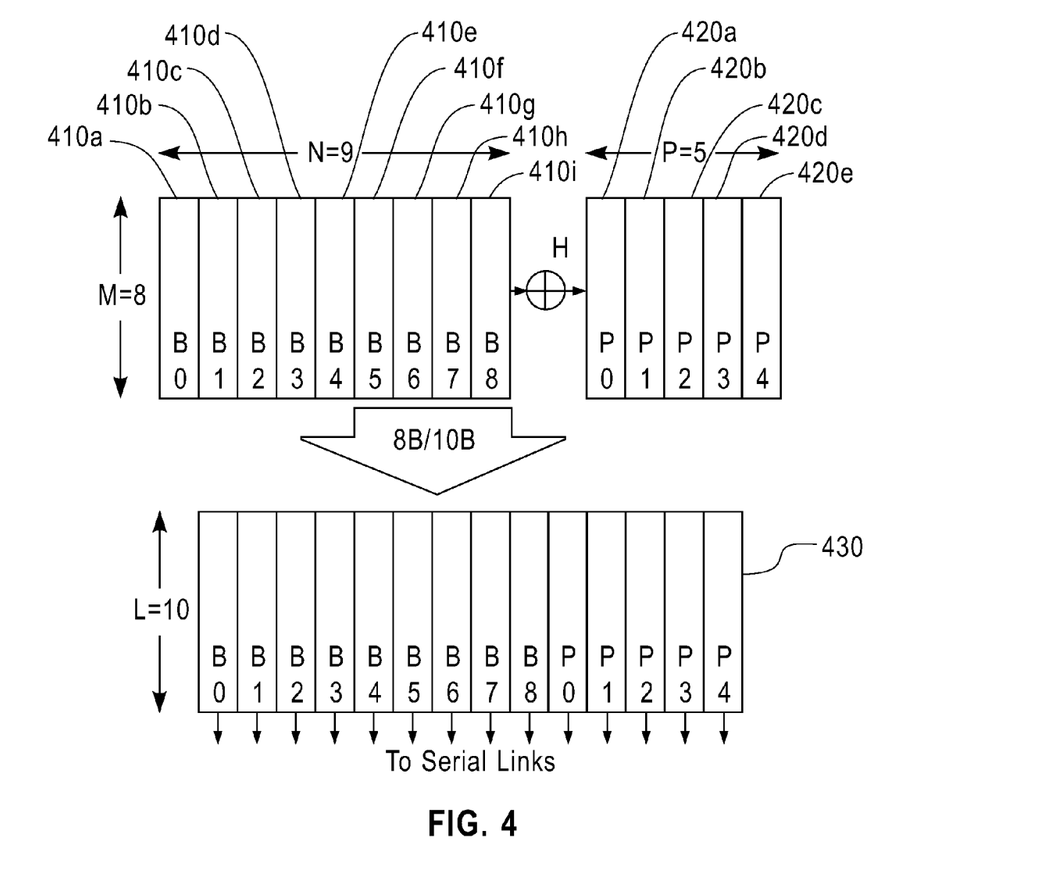
FIG. 4 illustrates an exemplary encoding process, according to an exemplary aspect of the present invention.

FIG. 4 illustrates an exemplary encoding process according to an exemplary aspect of the present invention. As illustrated in FIG. 4, data may be transmitted in 9 parallel data paths 410a-410i (e.g., N=9). This data may include, for example, data that has been deserialized for transmission via the parallel data paths.

A Hamming matrix H may be applied to a byte of data (e.g., M=8) in the data paths 410a-410i (e.g., in each of the data paths) to generate five parity bits (e.g., P=5) per bit position in each byte of data. These parity bits may be transmitted in five parity bit data paths 420a-420e.

That is, for every bit "0" in data paths 410a-410i, a first five parity bits are generated and transmitted in same timestamp as the bit "0" for every data path 410a-410i, for every bit "1" in data paths 410a-410i, a second five parity bits are generated and transmitted in same timestamp as the bit "1" for every data path 410a-410i, for every bit "2" in data paths 410a-410i, a third five parity bits are generated and transmitted in same timestamp as the bit "3" for every data path 410a-410i, and so on.

Figure 5:
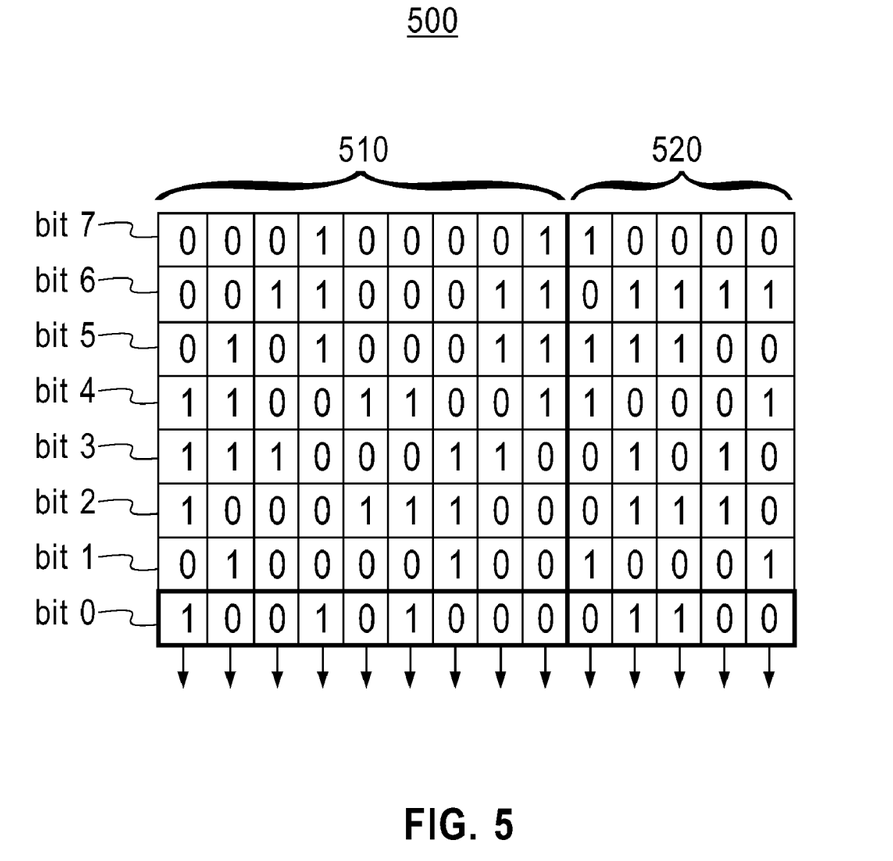
FIG. 5 illustrates a block of bits 500 that may be output from an encoder, according to an exemplary aspect of the present invention.

FIG. 5 illustrates a block of bits 500 that may be output from the encoder 220. The block of bits 500 includes nine bytes of data 510 (e.g., one byte for each of the 9 data paths) to be transmitted which is encoded by the encoder 220, and parity bits 520 which are generated by the encoder 220 for encoding the data 510.

The example of FIG. 5 like that of FIG. 4 includes 9 parallel data paths for transmitting data and 5 parallel data paths for transmitting the parity bits for encoding the data. However, this example should not be considered limiting, since the present invention may use other numbers of parallel data paths and other error correction codes.

In the example of FIG. 5, the block of bits 500 includes a "bit 0" data of "100101000" across the 9 parallel data paths, and the parity bits "01100" are generated by the encoder 220 for encoding the bit "0" data. The parity bits are transmitted in parallel with the "bit 0" data (e.g., "1001010000") which the parity bits are encoding and have a same timestamp as the "bit 0" data. That is, for example, in a first clock cycle in which the signal in FIG. 5 is transmitted, the "bit 0" data is transmitted along with the five parity bits "01100", in a second clock cycle in which the signal is transmitted, the "bit 1" data is transmitted along with the five parity bits "110001", and so on.

For example, assuming that the block of bits 500 was generated by the encoder 220 in FIG. 2, after the encoded data is transmitted along the data paths 210 and decoded in the decoder 230, the five parity bits may be used as an error correction code for correcting any errors in the transmitted data. That is, for example, any errors in the "bit 0" data may be corrected (e.g., in the error correction module 240) by using the five parity bits "01100", any errors in the "bit 1" data may be corrected by using the five parity bits "10001", and so on.

Referring again to FIG. 4, a serial friendly code such as, for example, an 8b/10b code may be used to encode the 8×14 block of bits, which may generate a 10×14 block of bits 430 (e.g., where L=10). This code may be used, for example, for bit and lane alignment. This 10×14 block of bits 430 may be transmitted, for example, to serial links such as in the serializer 275 in FIG. 2. It should be noted that the term "B0" is used to indicate data bit data path "0" (e.g., 8 bits of data where M=8, and 10 bits of data where L=10) in FIG. 4, and the term "P0" is used to indicate parity bit data path "0", and so on.

Referring again to FIG. 2, the decoder 230 in data transmission system 200 may decode the data transmitted over the parallel data paths 210 by working in the reverse order of the encoder 220. That is, the decoder may first decode the serializer friendly code (8b/10b in the example).

After the data is transformed back to non-coded data (e.g., byte-wide non-coded data), the parity bits (e.g., Hamming code) may be used to correct any bit errors. The error correction domains may include horizontal slices across all the data paths (e.g., lanes), so that a first correction operation may be used to correct all "bit 0's" of all 14 lanes, a second correction operation may be used to correct all "bit 1s" of all 14 lanes, and so on up to all "bit 7's". This decoding process may continue with eight error correction operations for every set of 14 uncoded bytes on the 14 lanes.

The error correction of the present invention may be considered effectively infinite interleaving. If an error propagates down a lane, bit 0 would effect bits 1, 2, 3 etc. However, since each bit is corrected independent of the other bits on the lane, all the errors are corrected.

Figure 6:
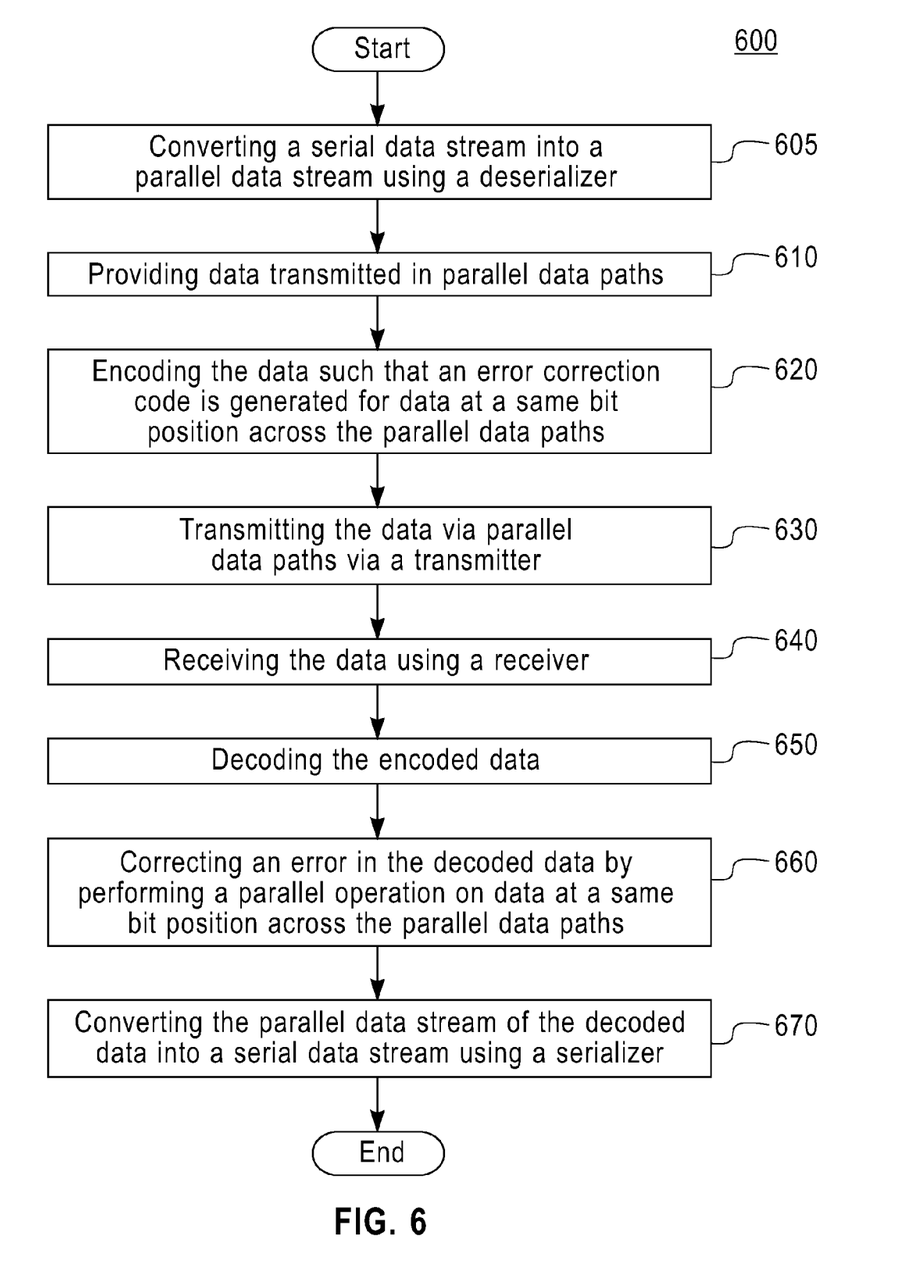
FIG. 6 illustrates a method 600 of correcting an error in parallel data paths of a data transmission system, according to an exemplary aspect of the present invention.

FIG. 6 illustrates a method 600 of correcting an error in parallel data paths of a data transmission system, according to an exemplary aspect of the present invention. As illustrated in FIG. 6, the method includes providing (610) data transmitted in parallel data paths, and encoding (620) the data such that an error correction code is generated for data at a same bit position across the parallel data paths.

As illustrated in FIG. 6, the method 600 may also include converting (605) a serial data stream into a parallel data stream using a deserializer. The parallel data stream may then be input to an encoder for encoding 610.

The method 600 may also include transmitting (630) the data via parallel data paths by using a transmitter, receiving (640) the data using a receiver, decoding (650) the encoded data, correcting (660) an error in the decoded data by performing a parallel operation on data at a same bit position across the parallel data paths, and converting (670) the parallel data stream (e.g., from an error correction module) into a serial data stream using a serializer.

Figures 7, 8:
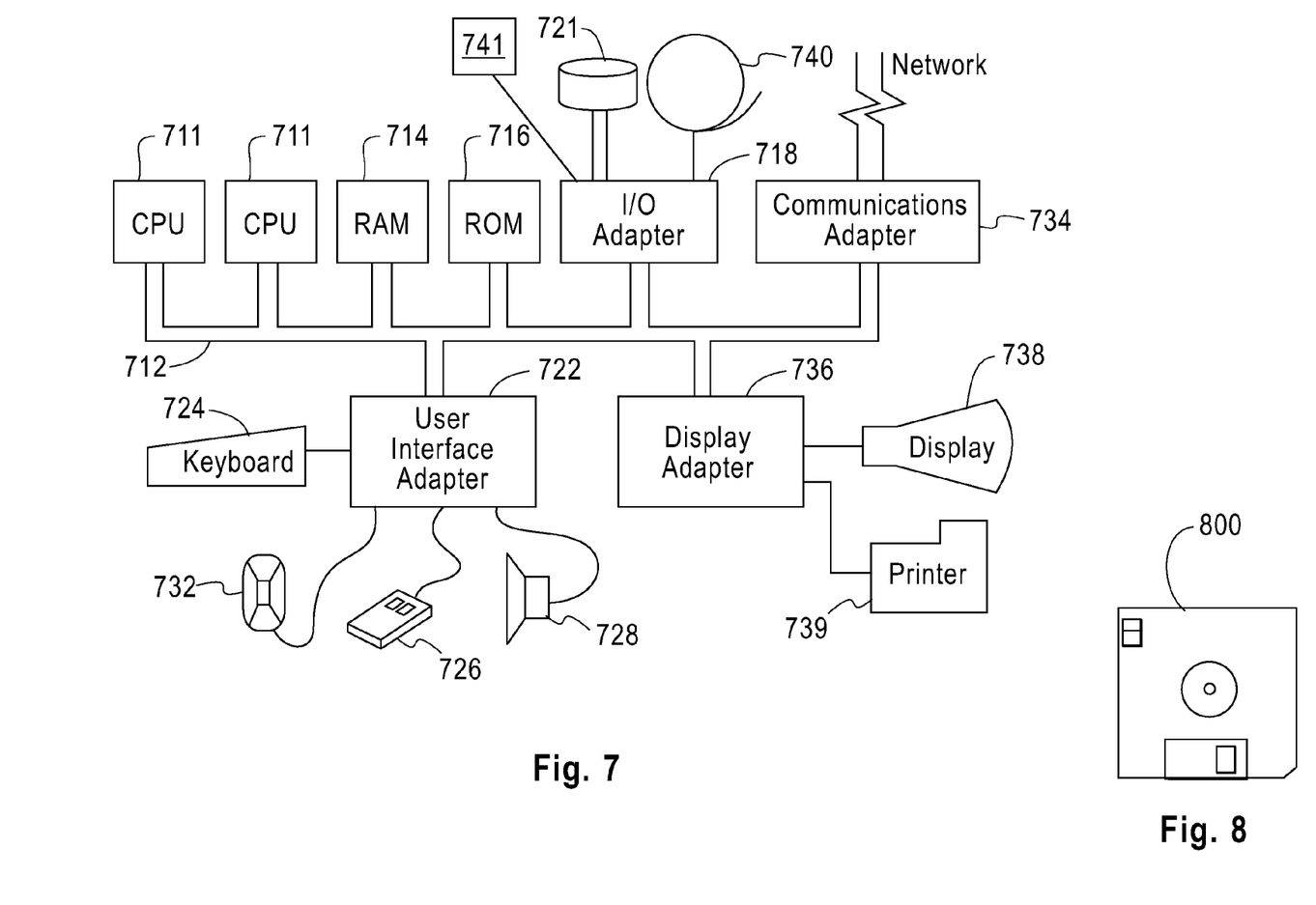
FIG. 7 illustrates an alternative embodiment (e.g., a typical hardware configuration 700) which may be used for implementing the system and method according to the exemplary aspects of the present invention.
FIG. 8 illustrates a programmable storage medium 800 tangibly embodying a program of machine-readable instructions executable by a digital processing apparatus to perform the method according to the exemplary aspects of the present invention.

Referring again to the drawings, FIG. 7 illustrates an alternative embodiment of the present invention (e.g., a typical hardware configuration 700) which may be used for implementing the data transmission system and method according to the exemplary aspects of the present invention. It should be noted that the present invention does not necessarily use a computer (e.g., such as in hardware configuration 700) for manipulating and correcting data. Instead, the present invention may be implemented using fixed logic in an application specific integrated circuit (ASIC) (e.g., see FIG. 2). With an ASIC implementation, the data could be corrected "on-thefly" at high speed, whereas a computer-only implementation may be more limited in the data rates that could be supported (e.g., achieved) by the present invention.

As illustrated in FIG. 7, the configuration 700 has preferably at least one processor or central processing unit (CPU) 711. The CPUs 711 are interconnected via a system bus 712 to a random access memory (RAM) 714, read-only memory (ROM) 716, input/output (I/O) adapter 718 (for connecting peripheral devices such as disk units 721 and tape drives 740 to the bus 712), user interface adapter 722 (for connecting a keyboard 724, mouse 726, speaker 728, microphone 732, and/or other user interface device to the bus 712), a communication adapter 734 for connecting an information handling system to a data processing network, the Internet, and Intranet, a personal area network (PAN), etc., and a display adapter 736 for connecting the bus 712 to a display device 738 and/or printer 739. Further, an automated reader/scanner 741 may be included. Such readers/scanners are commercially available from many sources.

In addition to the system described above, a different aspect of the invention includes a computer-implemented method for performing the above method. As an example, this method may be implemented in the particular environment discussed above.

Such a method may be implemented, for example, by operating a computer, as embodied by a digital data processing apparatus, to execute a sequence of machine-readable instructions. These instructions may reside in various types of signal-bearing media.

Thus, this aspect of the present invention is directed to a programmed product, including signal-bearing media tangibly embodying a program of machine-readable instructions executable by a digital data processor to perform the above method.

Such a method may be implemented, for example, by operating the CPU 711 to execute a sequence of machine-readable instructions. These instructions may reside in various types of signal bearing media.

Thus, this aspect of the present invention is directed to a programmed product, including signal-bearing media tangibly embodying a program of machine-readable instructions executable by a digital data processor incorporating the CPU 711 and hardware above, to perform the method of the invention.

This signal-bearing media may include, for example, a RAM contained within the CPU 711, as represented by the fast-access storage for example. Alternatively, the instructions may be contained in another signal-bearing media, such as a magnetic data storage diskette 800 (FIG. 8), directly or indirectly accessible by the CPU 711.

Whether contained in the computer server/CPU 711, or elsewhere, the instructions may be stored on a variety of machine-readable data storage media, such as DASD storage (e.g., a conventional "hard drive" or a RAID array), magnetic tape, electronic read-only memory (e.g., ROM, EPROM, or EEPROM), an optical storage device (e.g., CD-ROM, WORM, DVD, digital optical tape, etc.), paper "punch" cards, or other suitable signal-bearing media including transmission media such as digital and analog and communication links and wireless. In an illustrative embodiment of the invention, the machine-readable instructions may comprise software object code, complied from a language such as "C" etc.

With its unique and novel features, the present invention provides a data transmission system and more particularly, a method of correcting an error in parallel data paths of a data transmission system which may work effectively for high speed systems (e.g., >12 Gb/s).

While the invention has been described in terms of one or more exemplary embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A data transmission system comprising:
    parallel data paths for transmitting data;
    an encoder for encoding said data such that an error correction code is generated by the encoder for the data, the error correction code being transmitted in parallel across the parallel data paths and at a same bit position as the data that the error correction code is encoding, the encoding of the data comprising:
        generating an N/N+P Hamming code, where N is a number of bytes of data to be transmitted over N+P data paths, and P is a number of data paths available for parity and sparing; and
        encoding a block of bits of the data using a serializer-friendly code, the block of bits being M×(N+P), where M is a number of bits in a byte of the N bytes of data;
    a decoder for decoding the encoded data; and
    an error correcting module for correcting an error in the decoded data, by performing a parallel operation on the decoded data at a same bit position across the parallel data paths.

2. The data transmission system of claim 1, wherein said error correction code comprises a parity code.

3. The data transmission system of claim 1, wherein said error correction code comprises the N/(N+P) Hamming code, said encoder generating an H matrix comprising said Hamming code.

4. The data transmission system of claim 3, wherein columns of said H matrix are different and have parity.

5. The data transmission system of claim 3, wherein said encoder balances rows of said H matrix such that an implementation of said Hamming code will be balanced in fan-out.

6. The data transmission system of claim 1, wherein said serializer-friendly code comprises 8b/10b code.

7. The data transmission system of claim 1, further comprising:
    a transmitter for transmitting said data;
    a receiver for receiving said data transmitted by said transmitter, said parallel data paths transmitting said data from said transmitter to said receiver.

8. The data transmission system of claim 7, further comprising:
    a decision feedback equalizer (DFE) for removing intersymbol interference in said data.

9. The data transmission system of claim 8, wherein said DFE is included in a serial interface in one of said transmitter and said receiver.

10. A method of correcting an error in parallel data paths of a data transmission system, comprising:
    providing data transmitted in parallel data paths;
    encoding said data such that an error correction code is generated for the data, the error correction code being transmitted in parallel across the parallel data paths and at a same bit position as the data that the error correction code is encoding, the encoding of the data comprising:
  generating an N/N+P Hamming code, where N is a number of bytes of data to be transmitted over N+P data paths, and P is a number of data paths available for parity and sparing; and
  encoding a block of bits of the data using a serializer-friendly code, the block of bits being M×(N+P), where M is a number of bits in a byte of the N bytes of data;
decoding the encoded data; and
correcting an error in the decoded data, by performing a parallel operation on the decoded data at a same bit position across the parallel data paths.

11. The method of claim 10,
  wherein said error correction code comprises the N/(N+P) Hamming code, said encoder generating an H matrix comprising said Hamming code.

12. A non-transitory programmable storage medium tangibly embodying a program of machine-readable instructions executable by a digital processing apparatus to perform a method of correcting an error in parallel data paths in a data transmission system, said method comprising:
  providing data transmitted in parallel data paths;
  encoding said data such that an error correction code is generated for the data, the error correction code being transmitted in parallel across the parallel data paths and at a same bit position as the data that the error correction code is encoding, the encoding of the data comprising:
    generating an N/N+P Hamming code, where N is a number of bytes of data to be transmitted over N+P data paths, and P is a number of data paths available for parity and sparing; and
    encoding a block of bits of the data using a serializer-friendly code, the block of bits being M×(N+P), where M is a number of bits in a byte of the N bytes of data;
  decoding the encoded data; and
  correcting an error in the decoded data, by performing a parallel operation on the decoded data at a same bit position across the parallel data paths.

13. The method of claim 10, further comprising:
  deploying computing infrastructure in which computer-readable code is integrated into a computing system, such that said code and said computing system combine to perform said providing data transmitted in parallel data paths, and encoding said data such that an error correction code is generated for data at a same bit position across said parallel data paths.

* * * * *